United States Patent
Collet

(10) Patent No.: US 9,944,512 B2
(45) Date of Patent: Apr. 17, 2018

(54) METHOD FOR MANUFACTURING AN ELECTROMECHANICAL DEVICE AND CORRESPONDING DEVICE

(71) Applicant: TRONIC'S MICROSYSTEMS, Crolles (FR)

(72) Inventor: Joël Collet, Saint Martin D'uriage (FR)

(73) Assignee: TRONICS MICROSYSTEMS, Crolles (FR)

( * ) Notice: Subject to any disclaimer, the term of this patent is extended or adjusted under 35 U.S.C. 154(b) by 0 days.

(21) Appl. No.: 15/520,618

(22) PCT Filed: Nov. 9, 2015

(86) PCT No.: PCT/EP2015/076110
§ 371 (c)(1),
(2) Date: Apr. 20, 2017

(87) PCT Pub. No.: WO2016/075098
PCT Pub. Date: May 19, 2016

(65) Prior Publication Data
US 2017/0305739 A1    Oct. 26, 2017

(30) Foreign Application Priority Data

Nov. 10, 2014    (FR) ...................................... 14 60871

(51) Int. Cl.
*H01L 29/84* (2006.01)
*B81B 3/00* (2006.01)
(Continued)

(52) U.S. Cl.
CPC ........ *B81B 3/0051* (2013.01); *B81C 1/00182* (2013.01); *B81C 1/00333* (2013.01);
(Continued)

(58) Field of Classification Search
CPC ............... H01L 41/113; H01L 41/1132; H01L 41/1134; H01L 41/1136; B81B 3/0051;
(Continued)

(56) References Cited

U.S. PATENT DOCUMENTS

| 6,734,512 B2 * | 5/2004 | Suzuki | H01H 59/0009 257/401 |
| 2009/0026561 A1 * | 1/2009 | Reichenbach | B81C 1/00182 257/416 |

(Continued)

FOREIGN PATENT DOCUMENTS

| FR | 2925223 A1 | 6/2009 |
| FR | 2972263 A1 | 9/2012 |

(Continued)

OTHER PUBLICATIONS

International Search Report issued in PCT/EP2015/076110 dated Mar. 17, 2016.

*Primary Examiner* — Matthew E Warren
(74) *Attorney, Agent, or Firm* — Marshall, Gerstein & Borun LLP

(57) ABSTRACT

An electromechanical device includes a stack formed of an insulating layer interposed between two solid layers, and a micromechanical structure of predetermined thickness suspended above a recess of predetermined depth, the recess and the micromechanical structure forming one of the two solid layers of the stack, and the insulating layer forming the bottom of the recess.

9 Claims, 4 Drawing Sheets

(51) Int. Cl.
*B81C 1/00* (2006.01)
*G01L 9/00* (2006.01)
(52) U.S. Cl.
CPC .... *G01L 9/0042* (2013.01); *B81C 2201/0194* (2013.01); *B81C 2203/051* (2013.01)
(58) Field of Classification Search
CPC ..... B81B 2203/0109; B81B 2203/0118; B81C 1/00182; B81C 2201/019; B81C 2201/0191; B81C 2201/0194
USPC .................................................. 257/415, 522
See application file for complete search history.

(56) References Cited

U.S. PATENT DOCUMENTS

2015/0163599 A1\* 6/2015 Shim .................. B81C 1/00182
 381/150
2017/0101310 A1\* 4/2017 Partridge ............ B81C 1/00277

FOREIGN PATENT DOCUMENTS

| | | |
|---|---|---|
| JP | 2005177974 A | 7/2005 |
| WO | WO-2005/028359 A1 | 3/2005 |

\* cited by examiner

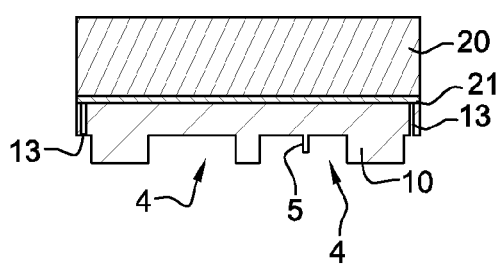
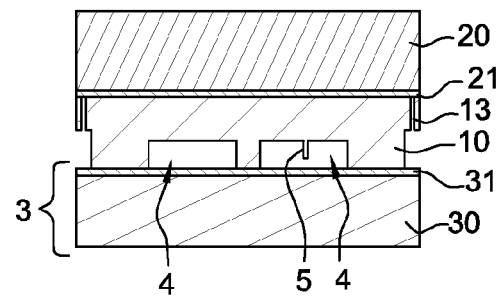
Fig. 1G  Fig. 1H
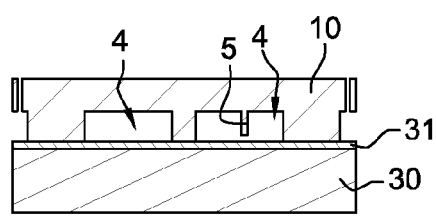
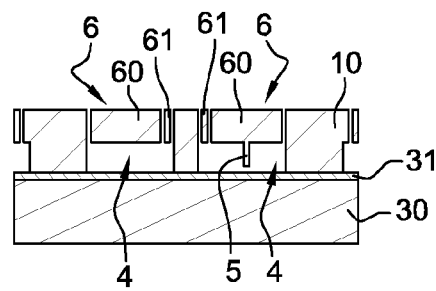
Fig. 1I  Fig. 1J

METHOD FOR MANUFACTURING AN ELECTROMECHANICAL DEVICE AND CORRESPONDING DEVICE

TECHNOLOGICAL FIELD

The present disclosure relates to the field of electromechanical systems formed of elements of micrometer-range dimensions, also called MEMSs (acronym for "Micro-Electromechanical System") and/or of elements of nanometer-range dimensions also called NEMSs (acronym for "Nano-Electromechanical System"). More particularly, the disclosure relates to a method of manufacturing such a system.

BACKGROUND

Conventionally, to decrease the size of electromechanical systems while guaranteeing a good sensitivity of measurements, it is advantageous to combine micro-electromechanical elements and nano-electromechanical elements. Such electromechanical are now known as M&NEMSs for "Micro- and Nano-ElectroMechanical Systems".

Such M&NEMSs comprise force sensors, such as accelerometers, gyrometers, or also magnetometers. Such force sensors typically come in the form of devices comprising a mobile mass mechanically held by deformable elements such as springs. The mobile mass is further mechanically coupled to deformable structures such as measurement beams used to measure displacements of the mass. The measurement beams may for example be strain gauges or also resonators. The mass-beam assembly is held in suspension above a recess.

For example, in the case of an accelerometer, during a displacement of the sensor, an inertia force applies to the mobile mass and induces strain on the measurement beam. Conventionally, in the case of a resonator-type measurement beam, the strain applied by the mass induces a variation of the resonator frequency, and in the case of a measurement beam of variable-resistance type, the strain applied by the mass induces a variation of the electric resistance. The acceleration can be deduced from these variations.

It should be understood that it is advantageous to combine a mobile mass of micrometer-range thickness and a measurement beam of nanometer-range thickness. In particular, a significant mass of the mobile element enables to maximize the inertia force and thus to induce sufficient strain for the measurement beam. Further, by preferring a beam of small thickness, the strain applied by the mass to the beam is maximized. Such a layout thus also has the advantage of increasing the sensitivity of the force sensor.

Document EP 1 840 582 discloses such a force sensor, that is, a sensor where the mobile mass has a thickness greater than that of the beam, and further provides a method of manufacturing such a sensor based on a SOI ("Silicon On Insulator") technology.

According to the first manufacturing method described in EP 1 840 582, the strain gauge is first etched in a surface layer of an SOI substrate, and then covered with a protection. A silicon epitaxy is then carried out on this surface layer to obtain a layer of desired thickness for the forming of the proof body. However, the epitaxial growth technique is complicated and expensive to implement and does not provide very large silicon layer thicknesses. Due to this limit, it is difficult to obtain an optimal sizing of the proof body, and thus of the mass thereof, to maximize the strain applied to the gauge.

According to the second manufacturing method described in EP 1 840 582, the mobile mass is first etched in an SOI substrate. A polysilicon layer of nanometer-range thickness is then deposited for the forming of the strain gauge. However, the small thickness of the polysilicon layers is still difficult to control, and their mechanical and electric properties are not as good as those of a single-crystal silicon layer. Further, the deposition of such a thin layer may be submitted to strain, such as deformations capable of affecting the gauge performance. It is thus difficult, with this method, to obtain a gauge having mechanical and electric features which optimize the sensor sensitivity.

Another solution may comprise using two different SOI substrates to separately form the mobile mass and the gauge, and then sealing the two substrates together. However, a misalignment of the different elements, particularly between the mobile mass, the gauge, and the recess, may occur during the sealing, thus increasing the risk of altering the general sensitivity of the sensor.

SUMMARY

In such a context, the present disclosure especially aims at providing a solution for the manufacturing of electromechanical devices free of the previously-mentioned limitations.

The disclosed embodiments thus aim at a method of manufacturing an electromechanical device comprising at least one micromechanical structure (or active body) of predetermined thickness suspended above a recess of predetermined depth.

According to the disclosed embodiments, the manufacturing method comprises sealing a first surface of a first substrate to a second substrate. The first substrate is only formed of a solid layer, and the second substrate is formed of at least one solid layer and of an insulating layer. Further, the sealing is performed so that the insulating layer of the second substrate is interposed between the first substrate and the solid layer of the second substrate.

The sealing of the two substrates is followed by the forming of the recess having said predetermined depth in the first substrate. The forming of this recess is particularly obtained by etching a second surface of the first substrate, this second surface being opposite the first surface of the first substrate. In particular, the thickness of the remaining portion of the first substrate which faces the recess is substantially equal to said predetermined thickness. In other words, the final depth of the recess and the final thickness of the micromechanical structure are defined by this etching.

The recess is then closed by sealing the second surface of the first substrate to a third substrate. The third substrate is formed of a solid layer and of an insulating layer. In particular, the insulating layer of this third substrate is placed in direct contact with the second surface of the first substrate to close the recess, which may be obtained by another sealing.

The solid layer and the insulating layer of the second substrate are then removed. Finally, the opening of the recess and the forming of the micromechanical structure are obtained via a single etching of the second surface of the first substrate.

Micromechanical structure means a structure having a thickness of micrometer-range dimensions. Further, the predetermined depth of the recess also preferably has micrometer-range dimensions.

Thus, the manufacturing method of the described embodiments is a simple and low-cost solution which enables to overcome the above-mentioned alignment problem, since the opening of the recess and the forming of the micrometer-range structure are obtained simultaneously by means of a single etch step. This single etching is made possible, in particular, by the successive forming of the future recess and of the future micromechanical structure in a same single-layer substrate, commonly called bulk. This is made possible by the use of two other clearly distinct substrates, one used as a support substrate to define the bottom of the recess, the other being used as a handle substrate or as a carrier.

Another advantage provided by this manufacturing method is that the bottom of the recess of the electromechanical device thus obtained is covered with an insulating layer, generally, an oxide layer. The presence of this insulating layer particularly has the advantage of preventing the occurrence of unevennesses resulting from the chemical process used, in particular, to open the recess. In other words, due to this insulating layer, the bottom of the recess will not be etched during the etch method implemented to open the recess. The resulting device is thus cleaner, that is, it contains less dust capable of blocking the active body or of interfering during measurements. Further, the risk of degassing of the inner surfaces of the recess is decreased, which enables to ensure a time-stable pressure in the package where the device is encapsulated.

Advantageously, the manufacturing method may further comprise, prior to the sealing of the first substrate to the second substrate, forming alignment marks on the first surface of the first substrate.

Conventionally, such alignment marks are used as indicators to ensure a correct positioning of the masks used in the etch methods implemented to form the recess and the micromechanical structure. Such alignment marks may in particular come in the form of predefined structures (verniers, squares, bar codes . . . ) and be obtained conventionally, for example, by an etch technique.

The method may also comprise, prior to the forming of the recess, exposing alignment marks on the second surface of the first substrate.

In particular, the alignment marks are covered during the step of sealing the first substrate to the second substrate, and then exposed prior to the step of etching the recess to make them visible on the second surface side of the first substrate.

The alignment marks may be recovered by lithography and etching of the second surface of the first substrate.

In practice, the manufacturing method may further comprise, prior to the forming of the recess, thinning the first substrate.

Indeed, the solid layer of the first substrate used may typically have an initial thickness of several hundreds of micrometers, for example, 450 µm. Further, the useful thickness of the solid layer for the forming of the recess and of the micromechanical structure is for example smaller than some hundred micrometers, for example, 50 µm. In this case, it is then necessary to provide a step of previous thinning of the solid layer to avoid too deep etchings. The thinning thus enables to obtain a residual thickness of the first substrate which is substantially equal to the predetermined thickness of the micromechanical structure added to the predetermined depth of the recess. The residual thickness typically corresponds to said useful thickness. In practice, the thinning may be obtained by grinding or chemical etching, chemical-mechanical etching, or dry etching.

According to a variation, the manufacturing method may further comprise, simultaneously to the forming of the recess, forming at least one stop inside of the recess, the stop extending from the first substrate towards the third substrate.

In practice, the forming of the recess and of the stop (or stopper) may be obtained by:
 a first lithography followed by a first etching to partially etch the recess in the first substrate and to define the height of the stop. The depth of this first etching is thus substantially equal to the desired distance (for example, 1 µm) between the free end of the stop and the insulating layer of the third substrate defining the bottom of the recess; and
 a second lithography and a second etching to definitively form the stop as well as the recess.

Thus, rather than being formed on the bottom of the recess, the stop is formed on the active body and particularly on the MEMS structure.

According to another embodiment where the electromechanical device also comprises a nanomechanical structure, the manufacturing method may further comprise, prior to the sealing of the first substrate to the second substrate, forming at least one pit having a predefined depth on the first surface of the first substrate. The bottom of the pit is, in particular, covered with a dielectric layer. Further, in this other embodiment, the forming of the recess further comprises forming a through hole connecting the recess to the pit.

The pit is particularly used to mark the location of the future nanomechanical structure. Nanomechanical structure means a structure having a thickness of nanometer-range dimensions. In practice, the pit may appear in the form of a hollowing and is formed prior to the forming of the alignment marks. The marking may be obtained by a double lithography of the first surface of the first substrate to:
 define a shallow hole, for example, shallower than 1 µm, for each nanometer-range structure on the first surface of the first substrate, each hole defining the location of a future nanomechanical structure which will be formed; and
 protecting the bottom of each hole with a dielectric.

Advantageously, the second substrate is formed of an insulating layer interposed between a solid layer and a layer which is thin as compared with the solid layer. Further, the first surface of the first substrate is preferably placed in direct contact with the thin layer of the second substrate.

In practice, the second substrate is thus formed of an insulating layer, for example, an oxide layer, interposed between a solid layer, of micrometer-range thickness and typically intended for the handling of the device being formed, and a thin layer called active layer, typically made of silicon, of nanometer-range thickness.

Thus, the step of sealing the first substrate to the second substrate particularly results in the direct sealing of the nanometer-range active layer of the second substrate to the micrometer-range solid layer of the first substrate.

According to a variation, the performing of the single etching to open the recess and form the micromechanical structure also comprises forming the nanomechanical structure in the thin layer of the second substrate, the nanomechanical structure facing the through hole. In other words, simultaneously to the opening of the recess and to the forming of the micromechanical structure, the nanomechanical structure is formed in the thin layer of the second substrate.

In practice, the etch step implemented to simultaneously open the recess and to form the micromechanical structure may also be used to form the nanomechanical structure. In other words, the recess and the micro- and nanomechanical structures are obtained via one and the same etching.

Of course, prior to the single etch step, it is also possible to provide a step intended to remove the solid layer and the insulating layer of the second substrate to only leave the active layer.

According to a variation, it is also possible to provide a step of doping the thin layer of the second substrate. In practice, the doping of the thin layer may be obtained by different doping techniques, such as for example, by diffusion, or by plasma immersion or ion-beam ion implantation.

The disclosed embodiments also aim at an electromechanical device comprising:
- a stack formed of an insulating layer interposed between two solid layers,
- a micromechanical structure of predetermined thickness suspended above a recess of predetermined depth, the recess and the micromechanical structure forming one of the two solid layers of the stack, and the insulating layer forming the bottom of the recess.

According to a variation, the electromechanical device may further comprise at least one stop inside of the recess, the stop extending from the micromechanical structure towards the insulating layer.

According to an embodiment, the solid layer comprises the micromechanical structure interposed between the insulating layer and a layer which is thin as compared with the solid layer. Further, according to this embodiment, the device may further comprise a nanomechanical structure formed in the thin layer and a through hole connecting the nanomechanical structure to the recess.

In practice:
- the nanomechanical structure may be a deformable measurement element such as a strain gauge, a deformable membrane, or also a nanomechanical resonator;
- the micromechanical structure may be formed of a mobile mass coupled to deformable elements such as springs, a membrane, or nanomechanical structures;
- the nanomechanical structure may have a thickness smaller than 1 µm;
- the micromechanical structure may have a thickness smaller than 100 µm and greater than 5 µm;
- the ratio of the thicknesses of the micromechanical and nanomechanical structures is in the order of 100;
- the solid layers and the thin layer are preferably made of silicon and the insulating layers are preferably made of oxide.

BRIEF DESCRIPTION OF THE DRAWINGS

The foregoing and other features and advantages of the disclosed embodiments will be discussed in detail in the following non-limiting description, in connection with the accompanying drawings, among which:

FIGS. 1A to 1J are simplified views illustrating the steps of the method of manufacturing an electromechanical device integrating an active structure of micrometer-range dimensions, according to an embodiment.

DETAILED DESCRIPTION

Figure 1A:
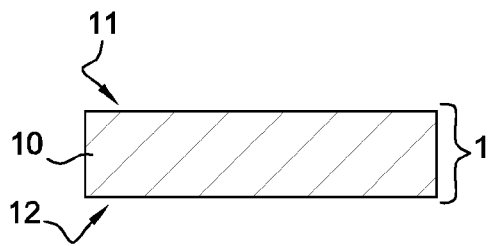
Figure 1B:
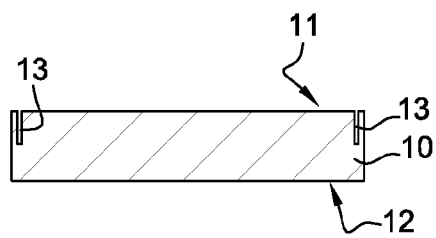
Figure 1C:
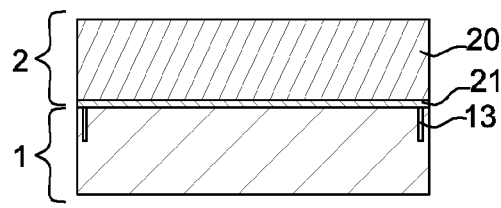

FIGS. 1A to 1J illustrate the different steps of a method of manufacturing an electromechanical device according to an embodiment. In particular, the electromechanical device which is desired to be obtained is illustrated in FIG. 1J and particularly integrates a micromechanical structure 60, 61 of predetermined thickness, for example, 20 µm, suspended above a recess 4 of predetermined depth, for example, 5 µm. For example, micromechanical structure 60, 61 is an active body formed, for example, of a mobile mass 60 coupled to springs 61. In a variation, the electromechanical device may further comprise a stop 5 which extends from micromechanical structure 60, 61 towards the bottom of recess 4. For example, the spacing between the free end of stop 5 and the bottom of recess 4 is substantially equal to 1 µm.

More particularly, the recess and the micromechanical structure are formed by etching in a same single-layer substrate which corresponds to first substrate 1 illustrated in FIG. 1A. First substrate 1, commonly called bulk, is thus only formed of a solid layer 10, for example, a silicon layer having a 450-µm thickness, and has two opposite surfaces, that is, a first surface 11 and a second surface 12.

First, to ensure a correct positioning of the masks which will be used during etchings, alignment marks 13 are formed (FIG. 1B) on first surface 11 of this first substrate 1.

Further, to ease the handling of first substrate 1, a second substrate 2 is sealed to first substrate 1 (FIG. 1O). Second substrate 2 is formed of a solid layer 20, for example, a silicon layer having a 450-µm thickness, and of an insulating layer 21, for example, an oxide layer having a 1-µm thickness. In particular, insulating layer 21 of the second substrate is placed in direct contact with first surface 11 of first substrate 1. At this stage, previously-formed alignment marks 13 are thus covered with second substrate 2.

Figure 1D:
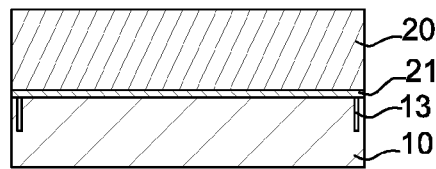
Figure 1E:
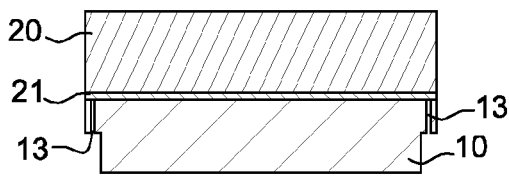
Figure 1F:
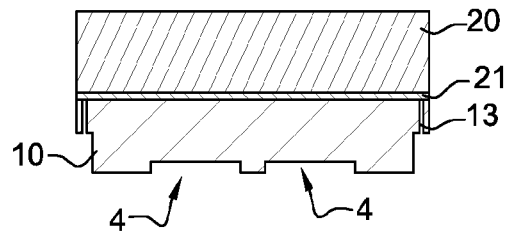

Since the recess and the micromechanical structure have to be formed in first substrate 1, a thinning of first substrate 1 is first performed (FIG. 1D). More particularly, the thinning is such that the residual thickness of first substrate 1 substantially corresponds to the predetermined thickness of micromechanical structure 60, 61 added to the predetermined depth of recess 4. Conventionally, the thinning may for example be obtained by grinding or chemical etching.

Alignment marks 13 are then exposed (FIG. 1E) by lithography and etching of second surface 12 of first substrate 1. Alignment marks 13 are thus made visible on the side of second surface 12 of first substrate 1.

In the case where a stop 5 is provided, a lithography, followed by a partial etching (FIG. 1F) is performed to start the etching of recess 4 in thinned first substrate 1 and to define the height of stop 5. In other words, the depth of the partial etching is substantially equal to the desired spacing between the free end of stop 5 and the bottom of recess 4.

Of course, when a stop 5 is not necessary, the partial etch step can be omitted.

A simple lithography (FIG. 1G) is then performed to form stop 5 and to define the depth of recess 4 in first thinned substrate 1. At this stage, the dimensions of recess 4 and of stop 5 already correspond to the desired final dimensions. Further, the thickness of the remaining portion of the first substrate opposite recess 4 is substantially equal to the desired final thickness of micromechanical structure 60, 61. Thus, recess 4, stop 5, and the thickness of micromechanical structure 60, 61 are defined by this single etching.

The next step comprises sealing a third substrate 3 to first substrate 1 to close recess 4 thus formed (FIG. 1H). The third substrate is also formed of a solid layer 30, for example, a silicon layer having a thickness greater than 300 µm, and of an insulating layer 31, for example, an oxide layer having a 1-µm thickness. Further, the sealing is such that insulating layer 31 of third substrate 3 is placed in direct contact with second surface 12 of first substrate 1.

Second substrate 2 is then removed (FIG. 1I) and a single etching (FIG. 1J) of first substrate 1 is performed to simultaneously open recess 4 and form micromechanical structure 60, 61.

The electromechanical device thus obtained (FIG. 1J) thus comprises a stack formed of an insulating layer 31 interposed between two solid layers 10, 30. Recess 4 and micromechanical structure 60, 61 are formed in one 10 of the two solid layers of the stack, and insulating layer 31 forms the bottom of recess 4.

Figure 2A:
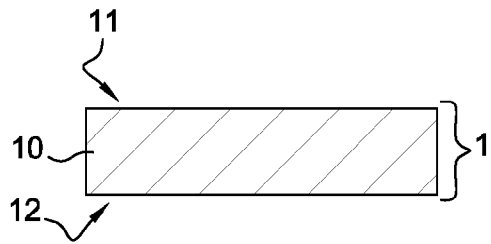
FIGS. 2A to 2K are simplified views illustrating the steps of the method of manufacturing an electromechanical device integrating an active structure of micrometer-range dimensions and an active structure of nanometer-range dimensions, according to another embodiment.
Figure 2B:
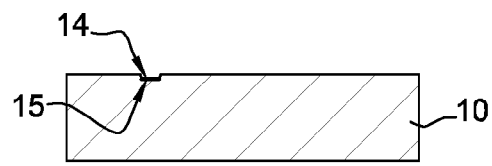
Figure 2C:
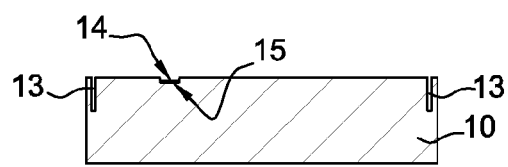
Figure 2D:
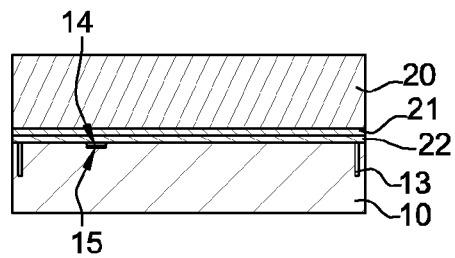
Figure 2E:
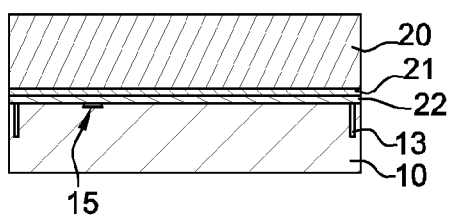
Figure 2F:
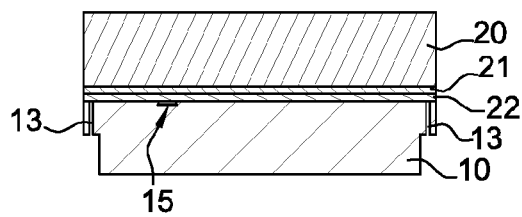
Figure 2G:
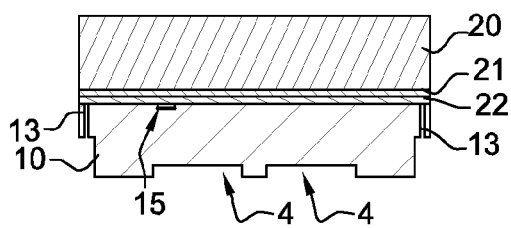
Figure 2H:
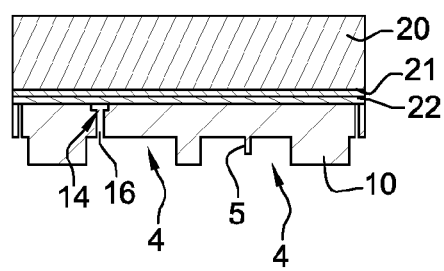
Figure 2I:
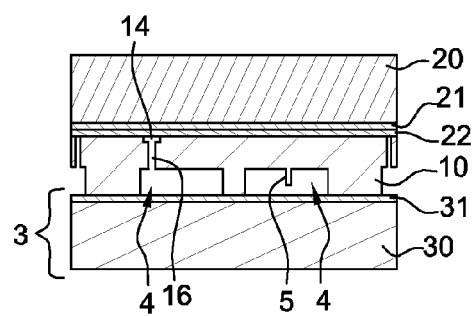
Figure 2J:
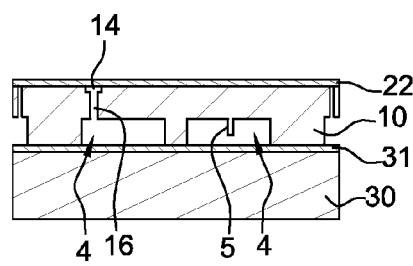
Figure 2K:
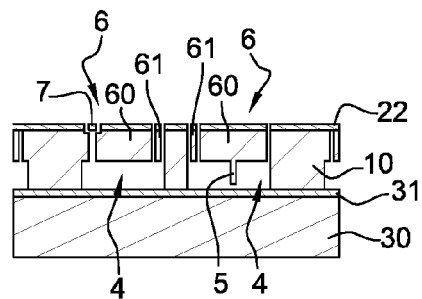

In another embodiment, the electromechanical device illustrated in FIG. 2K which is desired to be obtained integrates, in addition to above-described micromechanical structure 60, 61, recess 4 and stop 5, a nanometer-range structure 7 of predetermined thickness, for example, 250 nm, also suspended above recess 4. Nanomechanical structure 7 is for example a strain gauge. The method of manufacturing such a device is illustrated in FIGS. 2A to 2K.

As previously, recess 4, stop 5, and micromechanical structure 60, 61 are formed in a same bulk (FIG. 2A) identical to that previously used.

First, to mark the location of the future nanomechanical structure, a pit 14 is formed (FIG. 2B) on first surface 11 of first substrate 1, for example, by lithography. Such a pit of predetermined depth, generally smaller than 1 µm, has a bottom covered with a dielectric layer 15, for example, an oxide layer.

Then, as previously, to ensure a correct positioning of the masks used during etchings, alignment marks 13 are also formed (FIG. 2C) on first surface 11 of first substrate 1.

Further, to ease the handling of the first substrate and to seal the thin layer where the nanomechanical structure will be defined, a second substrate 2 is sealed to first substrate 1 (FIG. 2D). Second substrate 2 is formed of an insulating layer 21, for example, an oxide layer having a 1-µm thickness, interposed between a solid layer 20, for example, a silicon layer having a 450-µm thickness, and a layer 22 which is thin as compared with solid layer 20. Thin layer 22 is particularly a so-called "active" layer, typically a silicon layer of nanometer-range thickness, for example, 250 nm. During the sealing, thin layer 22 of second substrate 2 is placed in direct contact with the first surface 11 of first substrate 1. At this stage, alignment marks 13 and recess 14 are covered with second substrate 2.

As previously, first substrate 1 is thinned (FIG. 2E) so that the residual thickness of first substrate 1 also generally substantially corresponds to the predetermined thickness of micromechanical structure 60, 61 added to the predetermined depth of recess 4. Further, alignment marks 13 are also exposed (FIG. 2F) by lithography and etching of second surface 12 of first substrate 1.

Similarly, a lithography followed by a partial etching (FIG. 2G) are then performed to start the etching of recess 4 in first thinned substrate 1 and to define the spacing between the bottom of recess 4 and the free end of stop 5. Of course, when a stop is not necessary, the step of partial etching can be omitted.

A simple lithography (FIG. 2H) is then performed to form stop 5, to define the depth of recess 4 in first thinned substrate 1, and to form a through hole 16 to connect recess 4 to pit 14. In practice, dielectric layer 15 laid at the bottom of pit 14 protects thin layer 22 of the second substrate during this lithography, and is then removed.

A third substrate 3 identical to the previously-used third substrate is then sealed to the first substrate to close recess 4 thus formed (FIG. 2I). The sealing is such that insulating layer 31 of third substrate 3 is placed in direct contact with second surface 12 of first substrate 1.

The next step comprises removing solid layer 20 and insulating layer 21 of the second substrate (FIG. 2J) to only leave thin layer 22, and performing a single etching (FIG. 2K) to simultaneously open recess 4 and form micromechanical structures 60, 61 and nanomechanical structure 7. In particular, nanomechanical structure 7 is formed opposite through hole 16.

The electromechanical device thus obtained (FIG. 2K) thus comprises recess 4, micromechanical structure 60, 61, and stop 5 formed in the same solid layer 10, as well as nanomechanical structure 7 formed in thin layer 22 arranged on solid layer 10. Further, insulating layer 31 forms the bottom of recess 4.

The disclosed manufacturing methods are thus simple and generally have a low cost although three substrates are used. They particularly enable to obtain electromechanical MEMS- or M&NEMS-type devices which are less bulky and have better performances, where at least the recess and the micromechanical structure are formed in a single bulk. Further, the lifetime of such a device is increased due to the insulating layer at the bottom of the recess, which avoids the occurrence of unevennesses in the bottom of the recess during etchings. Finally, the provided solution also provides the possibility of adapting the thickness of the micrometer-range structure by simple adjustment of the etch equipment.

The invention claimed is:

1. A method of manufacturing an electromechanical device comprising at least one micromechanical structure of predetermined thickness suspended above a recess of predetermined depth, wherein the method comprises:
   sealing a first surface of a first substrate to a second substrate, the first substrate being only formed of a solid layer, the second substrate being formed of at least one solid layer and of an insulating layer, the insulating layer of the second substrate is interposed between the first substrate and the solid layer of the second substrate;
   forming the recess having said predetermined thickness in the first substrate, by etching a second surface of the first substrate opposite said first surface, the thickness of the remaining portion of the first substrate facing the formed recess is substantially equal to said predetermined thickness;
   closing the recess by sealing the second surface of the first substrate to a third substrate, said third substrate being formed of a solid layer and of an insulating layer in direct contact with the second surface of the first substrate;
   removing the solid layer and the insulating layer of the second substrate; and
   performing a single etching of the second surface of the first substrate to open the recess and form said micromechanical structure.

2. The manufacturing method of claim 1, further comprising, prior to the sealing of the first substrate to the second substrate, forming alignment marks on the first surface of the first substrate.

3. The manufacturing method of claim 2, further comprising, prior to the forming of the recess, exposing alignment marks on the second surface of the first substrate.

4. The manufacturing method of claim 1, further comprising, prior to the forming of the recess, thinning the first substrate.

5. The manufacturing method of claim 1, further comprising, simultaneously to the forming of the recess, forming at least one stop extending from the first substrate towards the third substrate.

6. The manufacturing method of claim 1, further comprising, prior to the sealing of the first substrate with the second substrate, forming at least one pit of predefined thickness on the first surface of the first substrate, the bottom of said pit being covered with a dielectric layer; and wherein
 the forming of the recess further comprises forming a through hole connecting the recess to said pit.

7. The manufacturing method of claim 6, wherein the second substrate is formed of an insulating layer interposed between a solid layer and a layer which is thin as compared with solid layer, and in that the first surface of the first substrate is placed in direct contact with the thin layer of the second substrate.

8. The manufacturing method of claim 6 wherein the performing of the single etching to open the recess and form the micromechanical structure also comprises forming a nanomechanical structure in the thin layer of the second substrate, said nanomechanical structure facing said through hole.

9. The manufacturing method of claim 6, further comprising a doping of the thin layer of the second substrate.

* * * * *